(12) United States Patent
Balakrishnan et al.

(10) Patent No.: US 9,871,140 B1
(45) Date of Patent: Jan. 16, 2018

(54) DUAL STRAINED NANOSHEET CMOS AND METHODS FOR FABRICATING

(71) Applicant: International Business Machines Corporation, Armonk, NY (US)

(72) Inventors: Karthik Balakrishnan, White Plains, NY (US); Michael A. Guillorn, Yorktown Heights, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/475,567

(22) Filed: Mar. 31, 2017

(51) Int. Cl.
| | |
|---|---|
| *H01L 29/66* | (2006.01) |
| *H01L 29/78* | (2006.01) |
| *H01L 21/762* | (2006.01) |
| *H01L 21/306* | (2006.01) |
| *H01L 21/3065* | (2006.01) |
| *H01L 27/092* | (2006.01) |
| *H01L 29/06* | (2006.01) |

(52) U.S. Cl.
CPC ...... *H01L 29/7848* (2013.01); *H01L 21/3065* (2013.01); *H01L 21/30604* (2013.01); *H01L 21/762* (2013.01); *H01L 27/092* (2013.01); *H01L 29/0665* (2013.01); *H01L 29/66545* (2013.01)

(58) Field of Classification Search
CPC ........... H01L 29/7848; H01L 21/30604; H01L 21/3065; H01L 21/762
USPC ....................................... 257/190, 191, 192
See application file for complete search history.

(56) References Cited

U.S. PATENT DOCUMENTS

2016/0064288 A1* 3/2016 Cheng .................. H01L 29/165
257/192

OTHER PUBLICATIONS

P. Hashemi et al.; "Electron Transport in Gate-All-Around Uniaxial Tensile Strained-Si Nanowire n-MOSFETs"; IEEE International Electron Devices Meeting; Dec. 16-18, 2008; IEDM 2008; whole document (4 pages).
P. Hashemi et al.; "Advanced Strained-Silicon and Core-Shell Si/Si 1-x Ge x Nanowires for CMOS Transport Enhancement"; ECS Transactions, 33 (6) 687-698; 2010; The Electrocemical Society; whole document (12 pages).

(Continued)

*Primary Examiner* — Tan N Tran
(74) *Attorney, Agent, or Firm* — Harrington & Smith; Louis J. Percello

(57) ABSTRACT

A method includes: growing a lattice of alternating sheets of tensile strained silicon and relaxed silicon-germanium on a substrate; isolating a first portion of the lattice from a second portion of the lattice; forming source regions and drain regions on each of the first portion of the lattice and the second portion of the lattice; forming a first gate opening in the first portion of the lattice and a second gate opening in the second portion of the lattice; selectively removing the sheets of relaxed silicon-germanium from under the second gate opening in the second portion of the lattice; selectively removing portions of the sheets of tensile strained silicon from under the first gate opening in the first portion of the lattice; and increasing a germanium content in the relaxed silicon-germanium layers under the first gate opening in the first portion of the lattice.

19 Claims, 12 Drawing Sheets

(56) References Cited

OTHER PUBLICATIONS

P. Hashemi et al.; "Replacement High-K/Metal-Gate High-Ge-Content Strained SiGe FinFETs with High Hole Mobility and Excellent SS and Reliability at Aggressive EOT ~ 7Å and Scaled Dimensions Down to Sub-4nm Fin Widths"; 2016 Sumposia on VLSI Technology and Circuits; 2016; IBM Research T.J. Watson Research Center; whole document (26 pages).

* cited by examiner

DUAL STRAINED NANOSHEET CMOS AND METHODS FOR FABRICATING

BACKGROUND

The exemplary embodiments described herein relate generally to semiconductor devices and methods for the fabrication thereof and, more specifically, to semiconductor devices having strained PFET and NFET nanosheet structures on the same substrate and methods for forming such structures.

A complementary metal oxide semiconductor device (CMOS) uses pairs of p-type and n-type metal oxide semiconductor field effect transistors (MOSFETs) arranged on silicon or silicon-on-insulator (SOI) substrates. A MOSFET, which is used for amplifying or switching electronic signals for logic functions, has source and drain regions connected by a channel. The source region is a terminal through which current in the form of majority charge carriers enters the channel, and the drain region is a terminal through which current in the form of majority charge carriers leaves the channel. In a p-type MOSFET (hereinafter "PFET"), the majority charge carriers are holes that flow through the channel, and in an n-type MOSFET (hereinafter "NFET"), the majority charge carriers are electrons that flow through the channel. The channel may be defined by an element such as one or more fins, one or more nanowires, or one or more sheets. Such fins, nanowires, or sheets include silicon. One or more gates are positioned over or around the channel to control the flow of current between the source and drain regions.

In devices that employ multiple gates or which use gate-all-around (GAA) technology, the devices benefit from electrostatics and immunity to short channel effects. However, the electron mobility in such multi-gate or GAA devices may be degraded by low-mobility sidewalls and other scattering mechanisms. As a result, strain engineering may be used to improve device performance.

Devices in which GAA nanosheets are employed are attractive candidates for 5 nanometer (nm) technology and beyond due to their excellent electrostatics. In such devices, however, increasing both electron and hole mobility for a CMOS structure may be challenging with regard to suspending nanosheet structures.

BRIEF SUMMARY

In one aspect, a method comprises: growing a lattice of alternating sheets of tensile strained silicon and relaxed silicon-germanium on a substrate; isolating a first portion of the lattice from a second portion of the lattice; forming source regions and drain regions on each of the first portion of the lattice and the second portion of the lattice; forming a first gate opening in the first portion of the lattice and a second gate opening in the second portion of the lattice; selectively removing the sheets of relaxed silicon-germanium from under the second gate opening in the second portion of the lattice; selectively removing portions of the sheets of tensile strained silicon from under the first gate opening in the first portion of the lattice; and increasing a germanium content in the relaxed silicon-germanium layers under the first gate opening in the first portion of the lattice.

In another aspect, a method comprises: disposing a strained relaxed buffer layer on a handle substrate; epitaxially forming alternating sheets of tensile strained silicon and relaxed silicon-germanium on the strained relaxed buffer layer to form a lattice; disposing an isolation structure on the epitaxially formed sheets to isolate a first portion of the lattice from a second portion of the lattice; disposing a first dummy gate and spacers on an upper sheet of the first portion of the lattice and a second dummy gate and spacers on an upper sheet of the second portion of the lattice; forming source regions and drain regions on the first portion of the lattice adjacent the first dummy gate and spacers and on the second portion of the lattice adjacent the second dummy gate and spacers; depositing an interlayer dielectric on an upper surface of the formed source regions and drain regions; masking the first portion of the lattice; removing the second dummy gate; selectively removing portions of the relaxed silicon-germanium sheets under a second location from which the second dummy gate was removed thereby forming voids above and below the remaining tensile strained silicon sheets; removing the mask from the masked first portion of the lattice; masking the second portion of the lattice; removing the first dummy gate; selectively removing portions of the tensile strained silicon from under a first location from which the first dummy gate was removed thereby forming voids above and below the remaining silicon germanium sheets; performing a low temperature condensation process to increase a germanium content in the relaxed silicon-germanium layers in the first portion of the lattice relative to the second portion of the lattice, wherein performing the low temperature condensation process reduces a thickness of the silicon-germanium layers in the first portion substantially to a thickness of the silicon sheets in the second portion; and filling the voids above and below the remaining tensile strained silicon sheets under the second location and above and below the remaining relaxed silicon germanium sheets under the first location with a high k dielectric/metal gate material.

In another aspect, an apparatus comprises: a substrate having a strained relaxed buffer layer; a PFET structure on the strained relaxed buffer layer, the PFET structure comprising, a PFET gate comprising a high k dielectric/metal gate material, alternating nanosheets of relaxed silicon-germanium and the high k dielectric/metal gate material under the PFET gate, and source and drain regions disposed adjacent the alternating nanosheets of relaxed silicon-germanium and the high k dielectric/metal gate material; an NFET structure on the strained relaxed buffer, the NFET structure comprising, an NFET gate comprising the high k dielectric/metal gate material, alternating nanosheets of tensile strained silicon and the high k dielectric/metal gate material under the NFET gate, and source and drain regions disposed adjacent the alternating nanosheets of tensile strained silicon and the high k dielectric/metal gate material; and an isolation structure separating the PFET structure and the NFET structure.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The word "exemplary" is used herein to mean "serving as, an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to alter their locations on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surfaces and do not deposit material on dielectric surfaces, such as silicon dioxide or silicon nitride surfaces.

Figure 1:
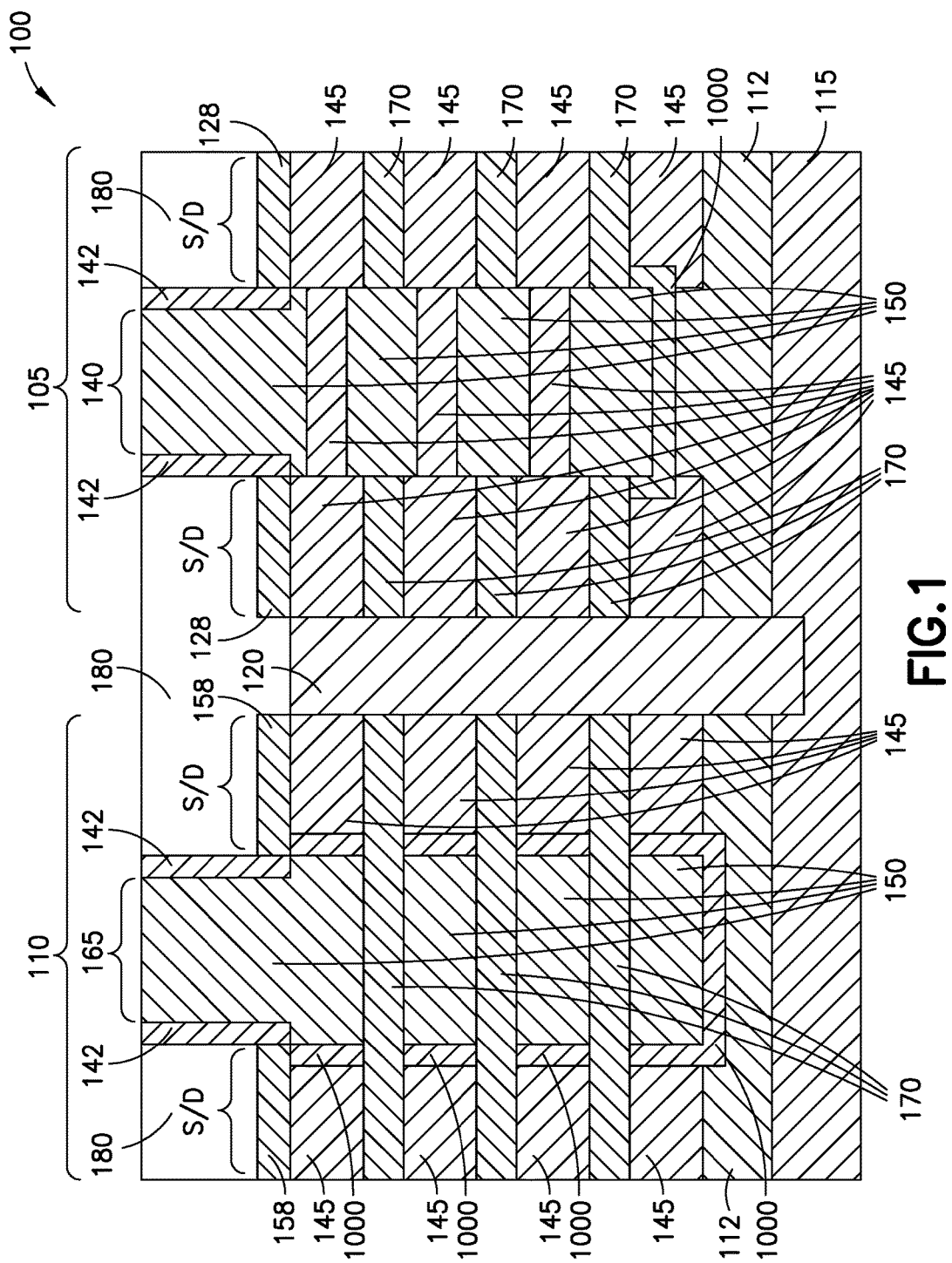
FIG. 1 is a schematic representation of a CMOS device comprising a PFET structure and an NFET structure, the device having stacked relaxed silicon-germanium (SiGe) nanosheets and tensile strained silicon (Si) nanosheets.

Referring to FIG. 1, one exemplary embodiment of a dual strained CMOS structure having pairs of PFETs and NFETs is designated generally by the reference number 100 and is hereinafter referred to as "device 100." Device 100 comprises a PFET structure 105 and an NFET structure 110 disposed on a strained relaxed buffer layer 112 (SRB layer 112), which is in turn disposed on a substrate 115 as a handle substrate. The substrate 115 comprises a bulk silicon material or silicon-germanium (Si—Ge) on insulator (SG-OI) material. The PFET structure 105 and the NEST structure 110 are separated on the substrate 115 by an isolation structure 120.

Each PFET structure 105 comprises source and drain regions (S/D regions) on opposite sides of a PFET gate structure 140. The PFET gate structure 140 includes a body of a fill metal 150 and adjacently-positioned spacers 142. Nanosheets of compressive SiGe 145 ($Si_{1-y}Ge_y$) are alternatingly arranged with the fill metal 150 under the body of the PFET gate structure 140. A first thin epitaxial layer 128 is disposed on each of the S/D regions, which comprise alternating layers of nanosheets of the SiGe 145 and silicon (Si) 170. In the PFET structure 105, a portion 1000 adjacent the SiGe 145 and above the SRB 112 has an increased germanium content (e.g., about 40%) and compressive strain buildup.

Each NFET structure 110 comprises S/D regions on opposite sides of an NFET gate structure 165. The NFET gate structure 165 includes a body of the fill metal 150 and adjacently positioned spacers 142. Nanosheets of the stacked tensile strained silicon 170 are alternatingly arranged with the fill metal 150 under the body of the NFET gate structure 165. A second thin epitaxial layer 158 is disposed on each of the S/D regions, which comprise alternating layers of the SiGe 145 and the silicon 170. In the NFET structure 110, portions 1000 adjacent the SiGe 145 have an increased germanium content (e.g., about 40%).

An interlayer dielectric 180 (ILD 180) is disposed over the PFET structure 105 and the NFET structure 110 and is polished using a chemical mechanical polish (CMP) so as to leave the PFET gate structure 140 and the NFET gate structure 165 exposed. Although only one PFET structure 105 and one NFET structure 110 are illustrated, it should be understood that any number of PFET structures 105 and NFET structures 110 may be disposed on the substrate 115 and any number of isolation structures 120 may be employed to separate the structures.

In the finished device 100 as disclosed herein, the tensile strained silicon 170 under the NFET gate structure 165 may have 0.8-1.2% tensile strain, and the relaxed SiGe 145 under the PFET gate structure 140 may have about 40-60% germanium and 0.8-1.2% compression.

Figure 2:
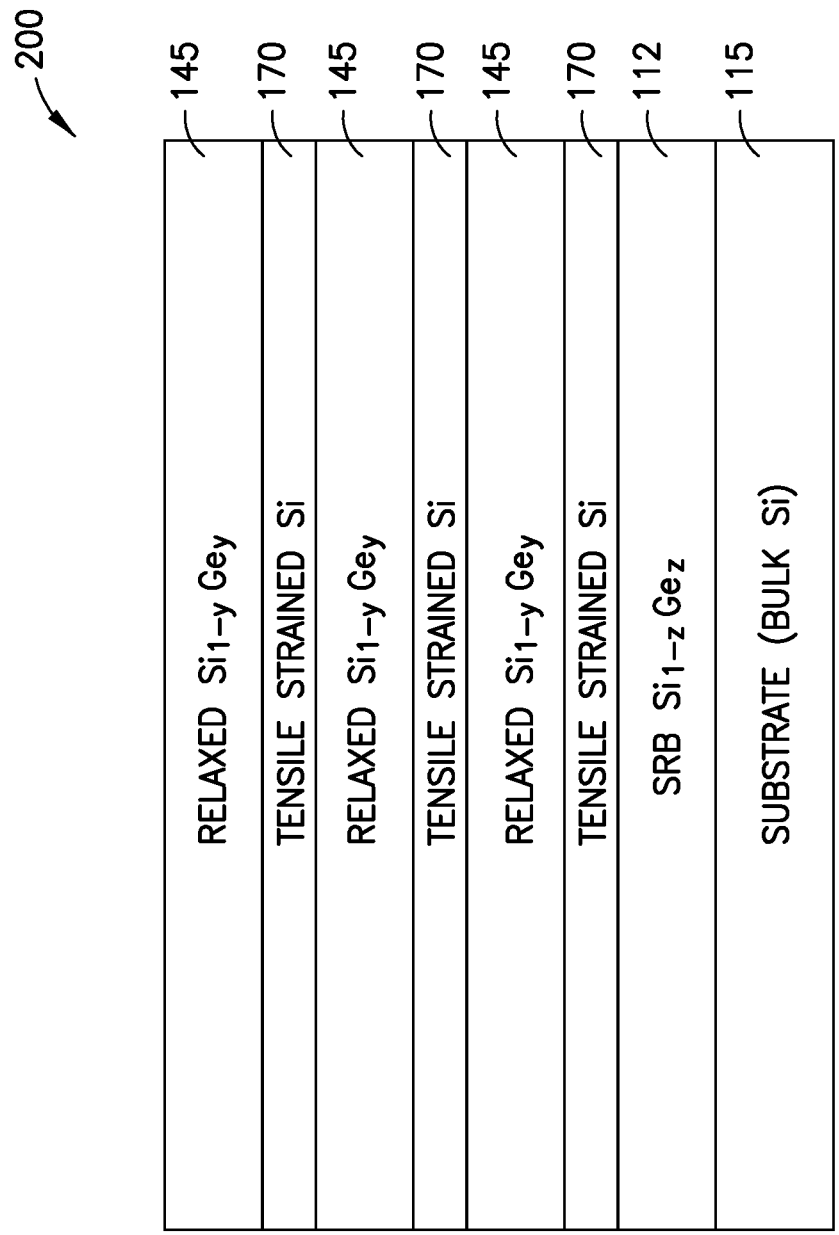
FIG. 2 is schematic representation of a handle substrate having a strained relaxed buffer layer and alternatingly stacked relaxed SiGe nanosheets and tensile strained silicon nanosheets.

Referring to FIG. 2, a process of forming alternating layers of the tensile strained silicon 170 and the relaxed SiGe 145 on the SRB layer 112 is shown generally at 200. In the process 200, the substrate 115 is provided, and the SRB layer 112 is disposed thereon. In some embodiments, the SRB layer 112 may be fabricated using known methods such as graded buffer or plastic/elastic relaxation. In other embodiments, an epitaxial layer may be epitaxially grown on the substrate 115 to form the SRB layer 112. In one exemplary embodiment, the SRB layer 112 may be a $Si_{1-z}Ge_z$ epitaxial layer and may comprise, for example, 20% to 30% germanium (Ge).

Alternating layers of the tensile strained silicon 170 and the relaxed SiGe 145 are then epitaxially grown as nanosheets on the SRB layer 112 to form a lattice. Dimensions for each nanosheet formed by the respective layers of the lattice may be 4-10 nanometers (nm) in thickness and 4-20 nm in width. Epitaxial growth of the tensile strained silicon 170 and relaxed SiGe 145 may be carried out using any suitable epitaxial growth process and apparatus. Exemplary processes and associated apparatuses for such processes include, but are not limited to, chemical vapor deposition (CVD), rapid thermal CVD (RTCVD), ultra-high vacuum CVD (UHVCVD), atmospheric pressure CVD (APCVD), low-energy plasma deposition (LEPD), and molecular beam epitaxy (MBE).

Figure 3:
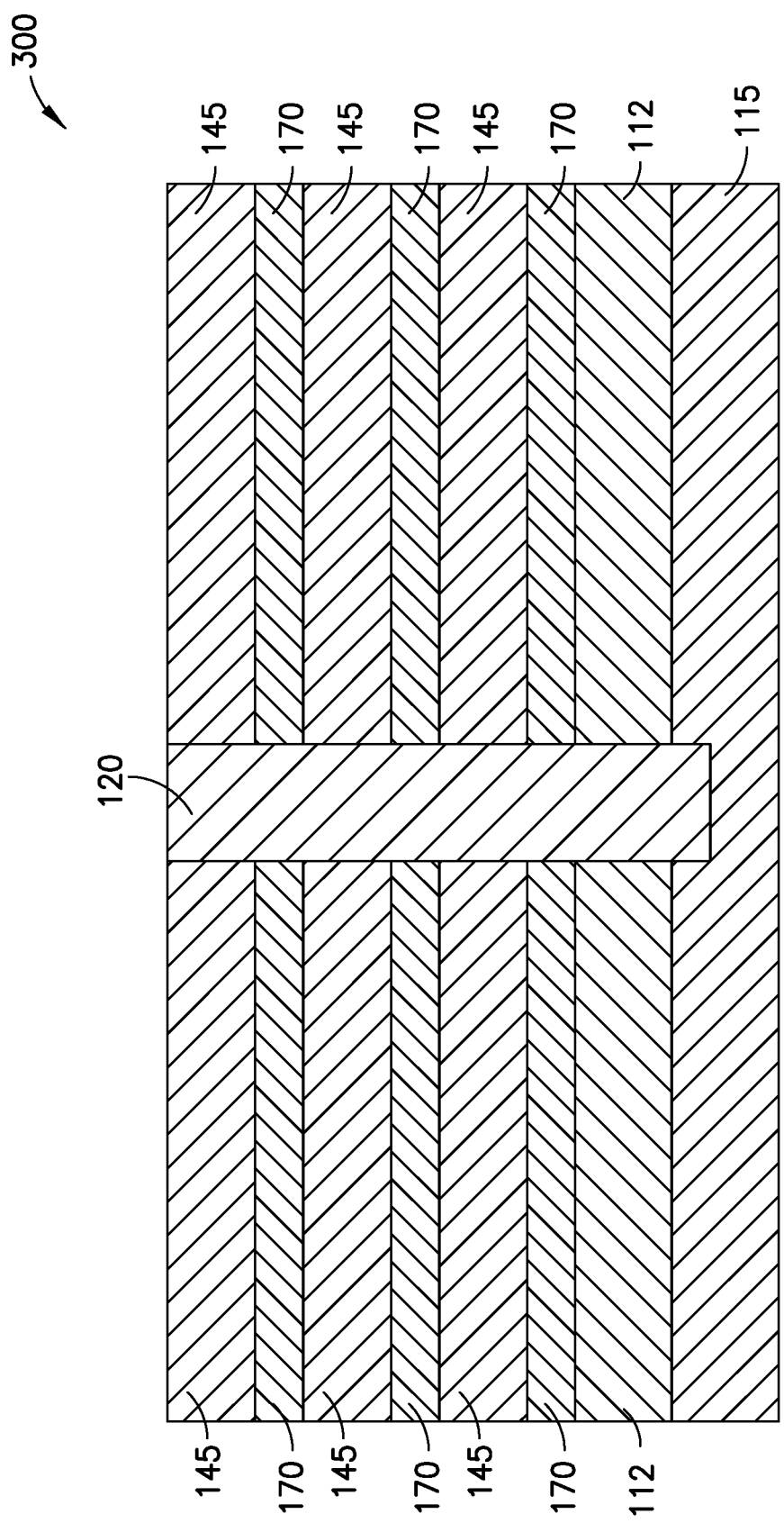
FIG. 3 is a schematic representation of the alternatingly stacked nanosheets of FIG. 2 having an isolation structure formed thereon.

Referring to FIG. 3, after growth of the alternating layers of tensile strained silicon 170 and relaxed SiGe 145 forming the nanosheet structure, processing 300 is carried out to isolate the structures that will subsequently form the PFET structure 105 and the NFET structure 110. In the processing 300, a hardmask may be deposited on the uppermost layer of the relaxed SiGe 145, and the layers may be patterned for the formation of fins (or other PFET or NFET structure). The isolation structure 120 may then be formed and doped (if desired) by standard methods.

Figure 4:
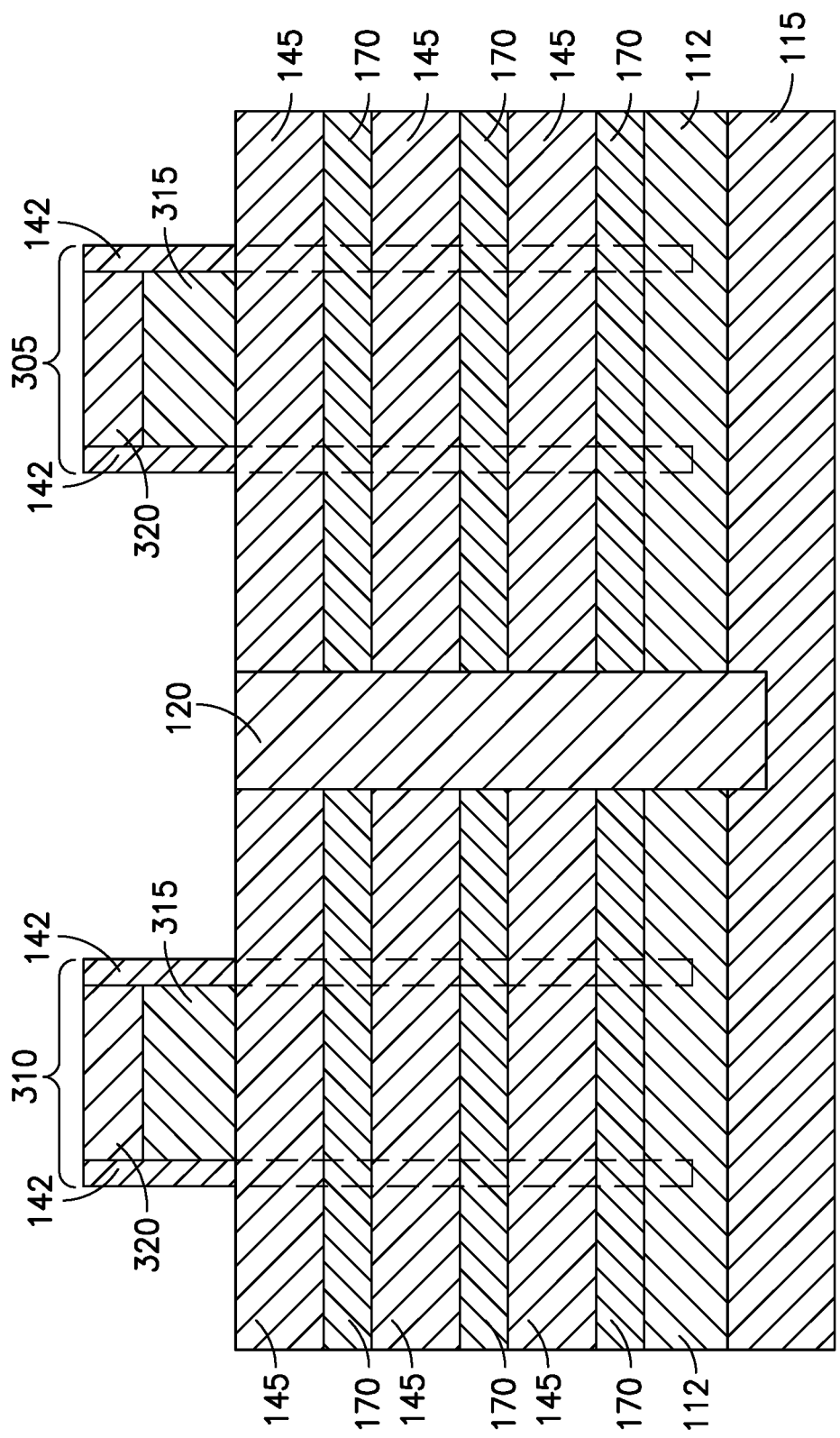
FIG. 4 is a schematic representation of the alternatingly stacked nanosheets of FIG. 3 having dummy gates formed thereon.

Referring to FIG. 4, sacrificial dummy gates 305, 310 and the spacers 142 are formed on the PFET portions and NFET portions of the nanosheets with the isolation structure 120 therebetween. The dummy gates 305, 310 may each comprise a body portion 315 of polysilicon (or metal or a combination of polysilicon and metal) deposited via low pressure CVD (LPCVD) or any other suitable method. Each dummy gate 305, 310 may include a hardmask 320 deposited onto the body portion 315. Each hardmask 320 may comprise, for example, a nitride (silicon nitride, carbon nitride, or the like) or a silicide and may be deposited via LPCVD. The spacers 142 are formed adjacent each dummy gate 305, 310.

Figure 5:
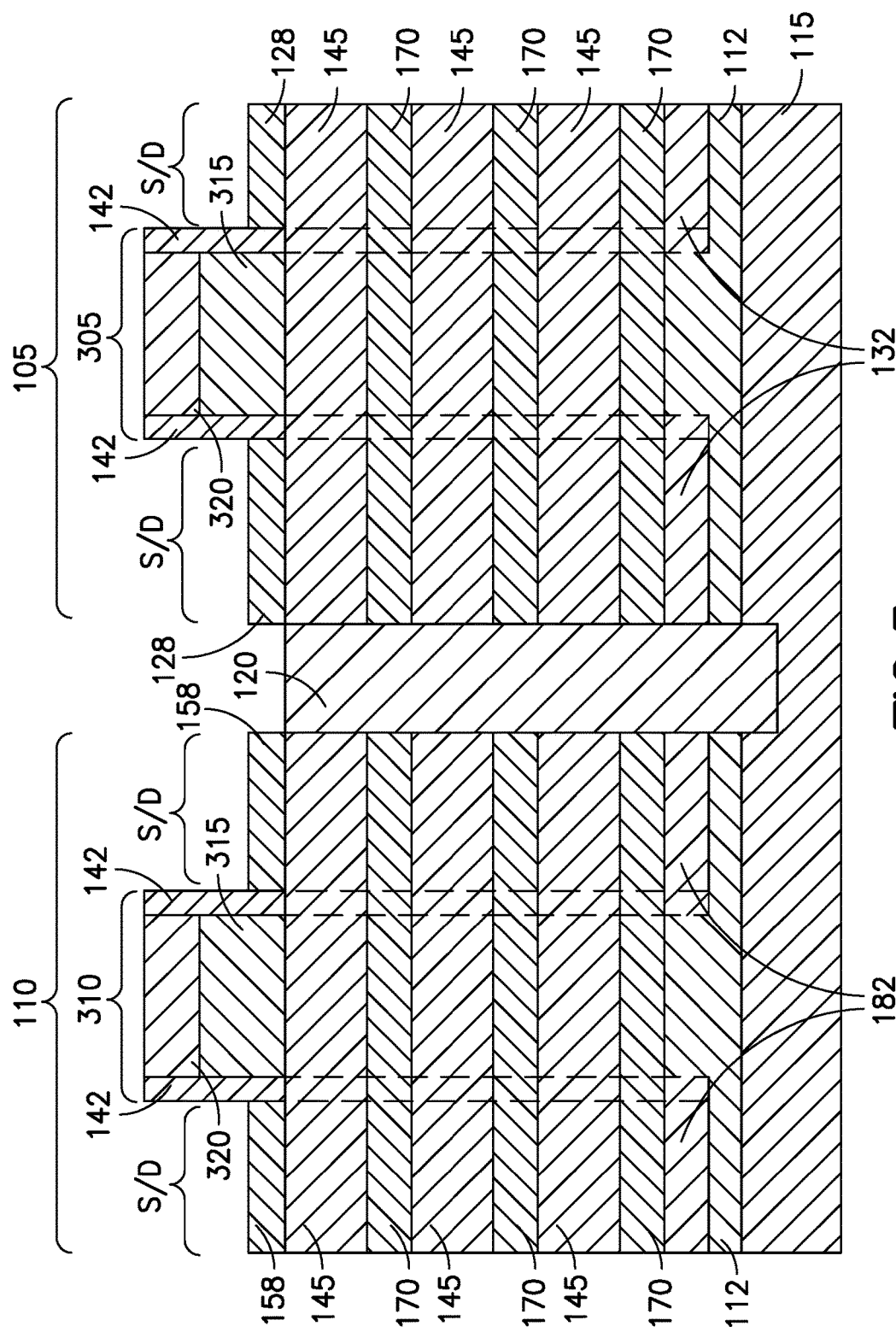
FIG. 5 is a schematic representation of the alternatingly stacked nanosheets and dummy gates with thin epitaxial layers deposited adjacent to the dummy gates.

Referring now to FIG. 5, the S/D regions on either side of the dummy gate 305 on the PFET structure 105 may be formed, in some exemplary embodiments, by deposition of the first thin epitaxial layer 128 and subsequent driving of the first thin epitaxial layer 128 into the alternating layers of silicon 170 and SiGe 145 down to the SRB layer 112. The first thin epitaxial layer 128 may be deposited using LPCVD (or any other suitable deposition technique). As shown, materials that may be deposited as the first thin epitaxial layer 128 to form the S/D regions include, but are not limited to, SiGe to form P+ regions on the PFET structure 105.

Also, the S/D regions on either side of the dummy gate 310 on the NFET structure 110 may also be formed, in some exemplary embodiments, by deposition of a second thin epitaxial layer 158 into the alternating layers of silicon 170 and SiGe 145 down to the SRB layer 112. The second thin epitaxial layer 158 may be deposited using LPCVD (or any other suitable deposition technique). As shown, materials that may be deposited as the second thin epitaxial layer 158 to form the S/D regions include, but are not limited to, silicon or carbon-doped silicon to form N+ regions on the NFET structure 110.

In other exemplary embodiments, the S/D regions may be formed by implantation of ions.

Figure 6:
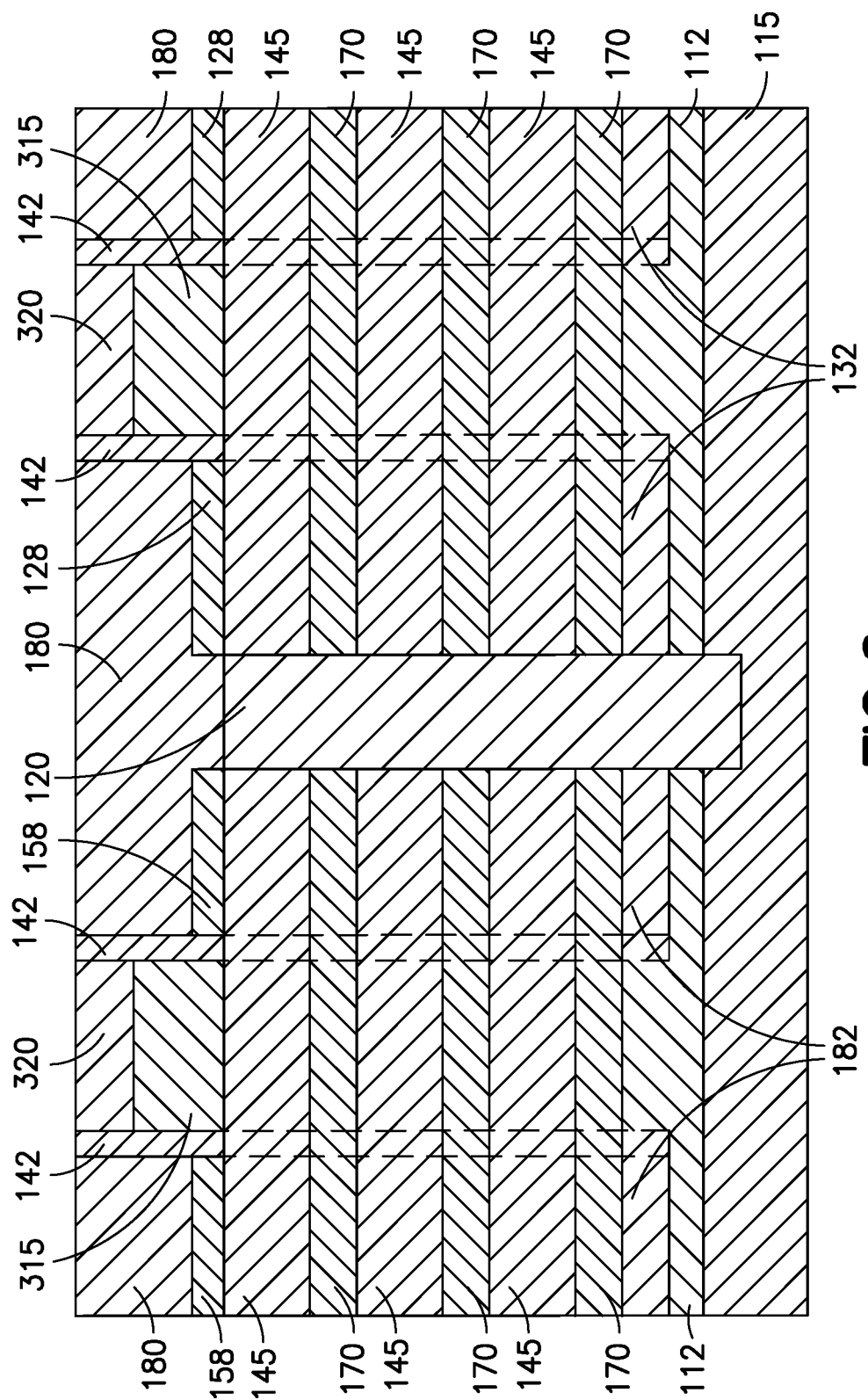
FIG. 6 is a schematic representation of the structure of FIG. 5 with an interlayer dielectric (ILD) deposited onto an upper surface thereof.

Referring to FIG. 6, the ILD 180 is deposited onto the S/D regions by CVD. The resulting structure is then planarized using a chemical mechanical polish (CMP). Materials from which the ILD 180 may be formed include oxides such as $SiO_2$.

Figure 7:
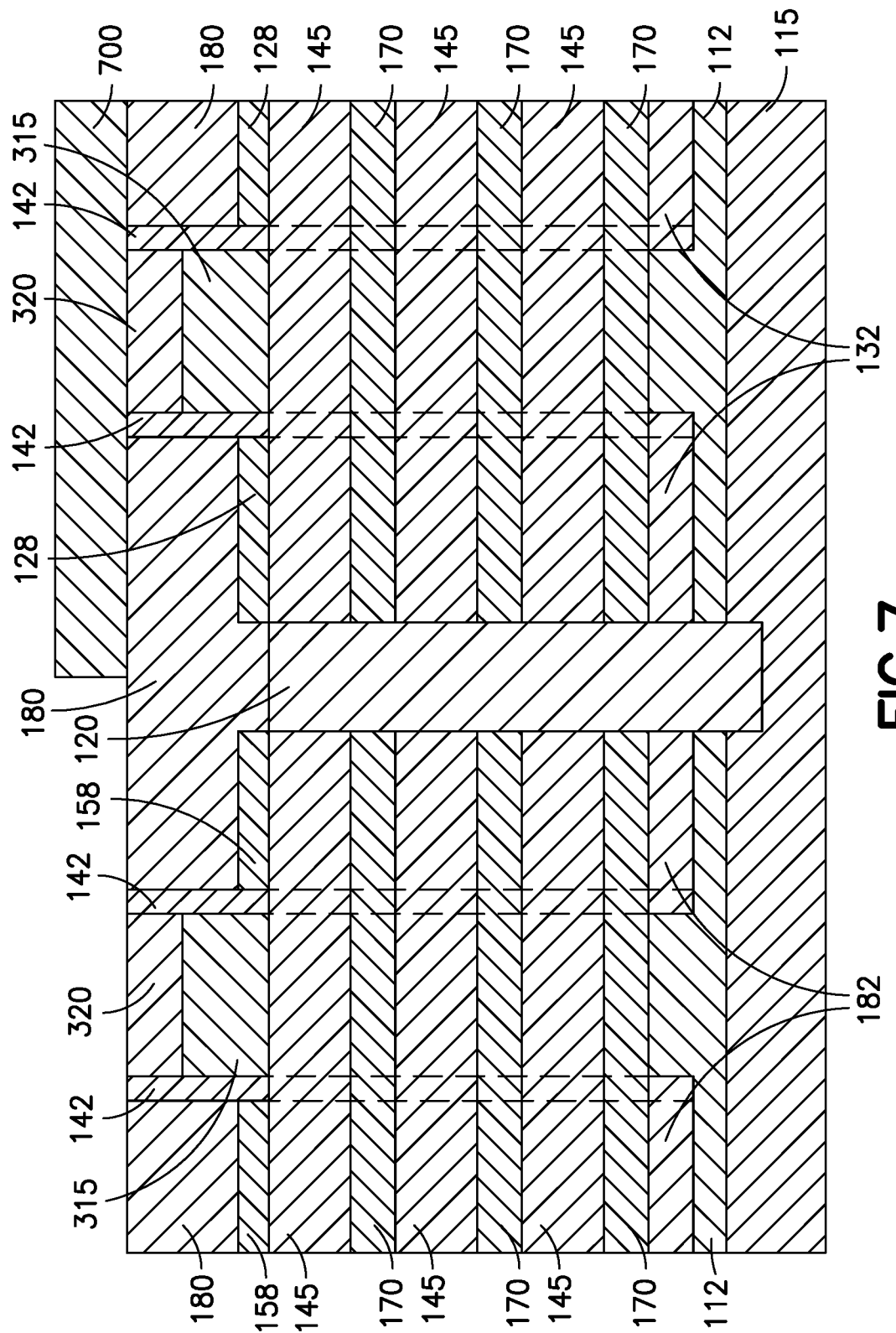
FIG. 7 is a schematic representation of the structure of FIG. 6 with the PFET portion masked.

Referring to FIG. 7, the PFET structure 105 is masked using any suitable PFET masking material 700.

Figure 8:
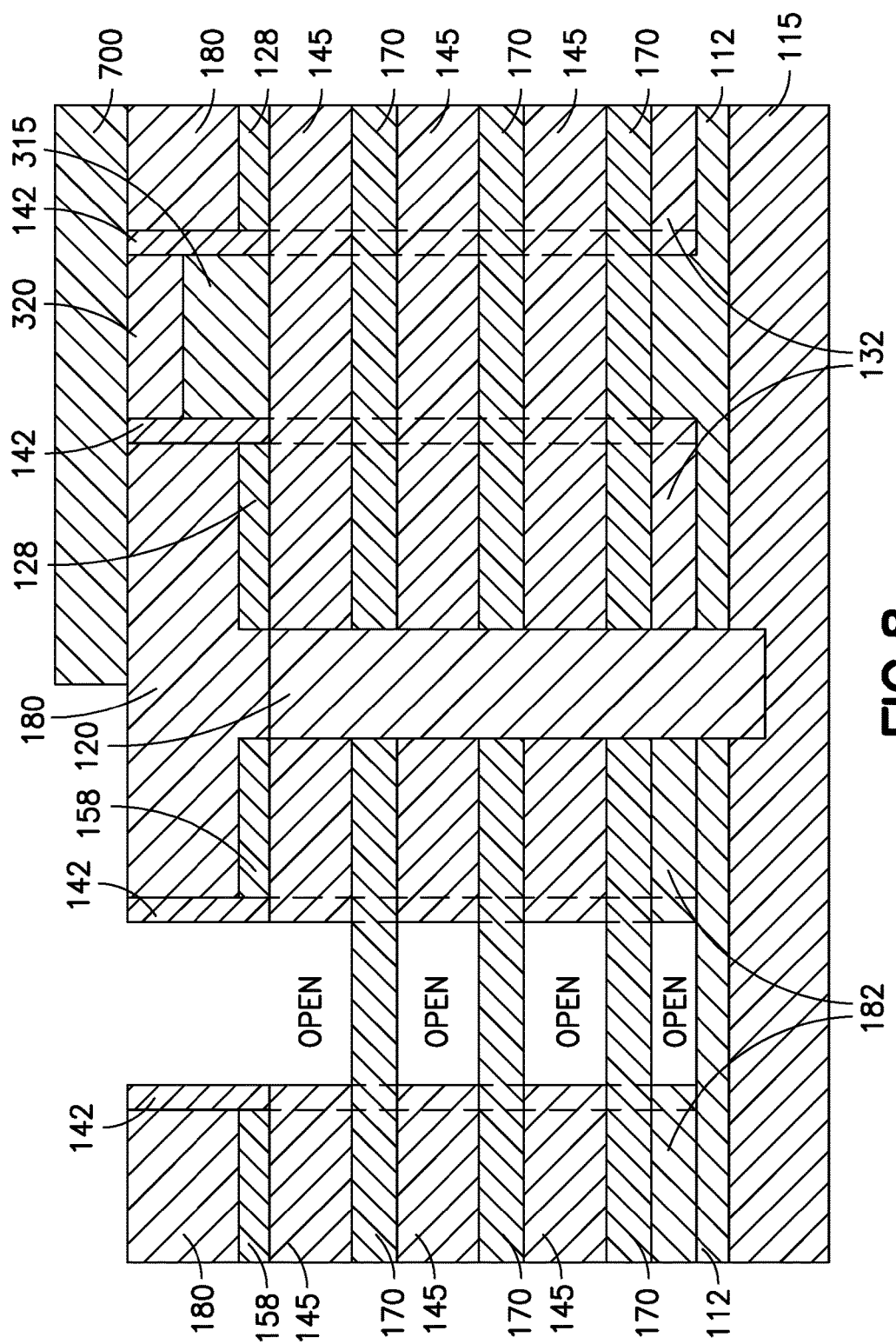
FIG. 8 is a schematic representation of the structure of FIG. 7 with the body portion and hardmask cap of the dummy gate removed from the NFET portion and with the relaxed SiGe layers removed from the NFET portion.

Referring to FIG. 8, the dummy gates 310 are removed from the NFET structure 110 in an etching process that comprises a combination of a dry etch process (e.g., a reactive ion etch (RIE), plasma etching, or the like) and a wet etch process (e.g., using phosphoric acid ($H_3PO_4$)). Preferably, the hardmask 320 is removed using the dry etch process. Once the hardmask 320 is removed, the body portion 315 may be removed using the wet etch process.

Etching is then carried out to selectively remove the relaxed SiGe 145 layers down to the SRB layer 112. In exemplary embodiments, the selective removal of the SiGe 145 layers may be carried out using HCl gas. Thus, the relaxed SiGe 145 layers under the gate structure in the NFET structure 110 are sacrificial. Optional trimming of the remaining tensile strained Si may be carried out to achieve target dimensions or to match the final dimensions of the NFET structure 110 to the PFET structure 105. Open areas are designated as "OPEN."

Figure 9:
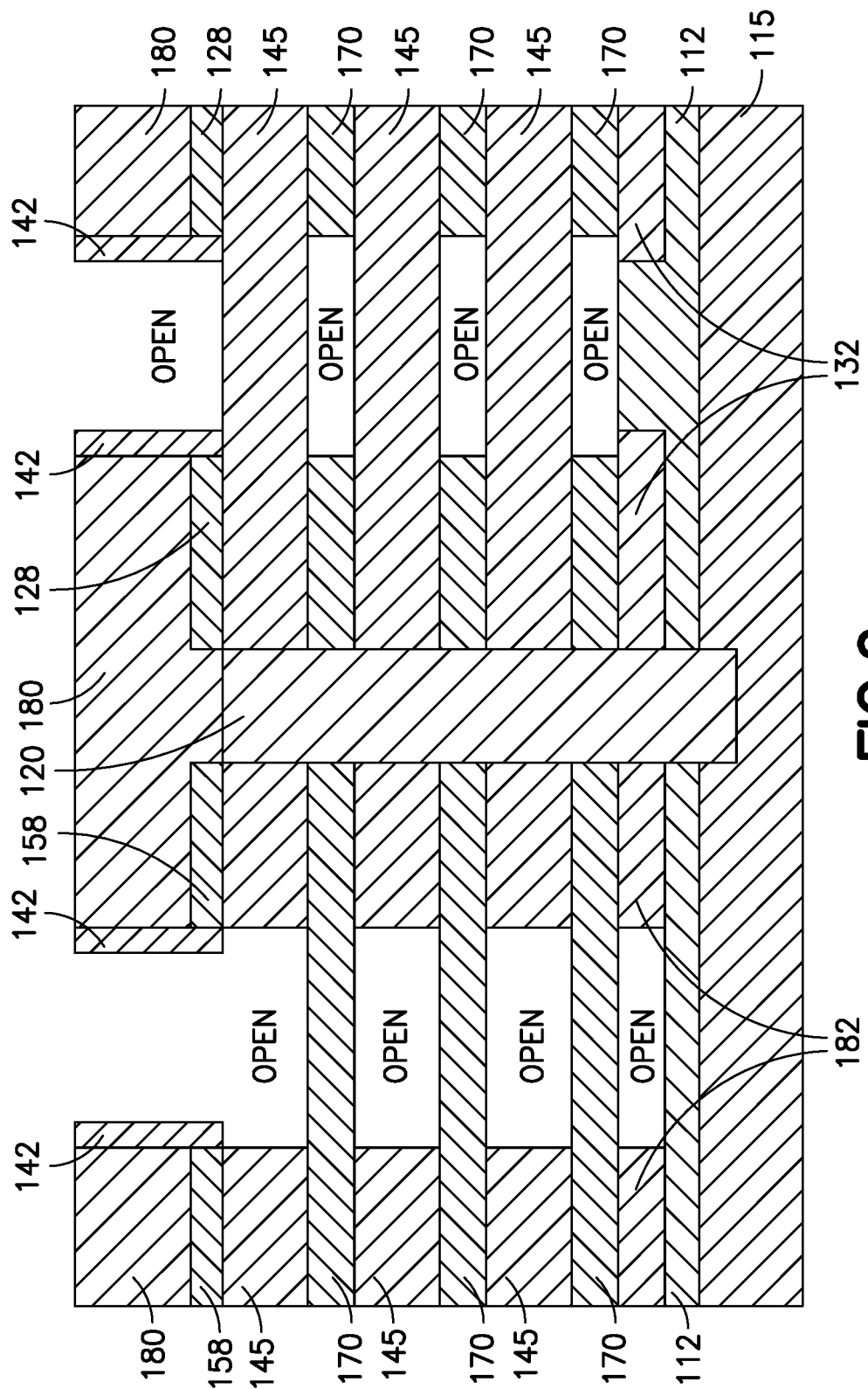
FIG. 9 is a schematic representation of a structure with the relaxed SiGe layers removed from the NFET portion and with the tensile strained Si layers removed from the PFET portion.

Referring to FIG. 9, the PFET masking material 700 is removed, and the NFET structure 110 is masked using any suitable NFET masking material (not shown). The hardmask 320 and the body portion 315 are removed from the PFET structure 105 in an etching process that is similar to that used to remove the hardmask 320 and the body portion 315 from the NFET structure 110.

Etching is then carried out to selectively remove the tensile strained layers of Si 170 down to the SRB layer 112. Selective removal of the Si 170 layers may be carried out using, for example, KOH or TMAH (tetramethylammonium hydroxide). The NFET masking material is then removed from the NFET structure 110. Open areas are designated as "OPEN."

Figure 10:
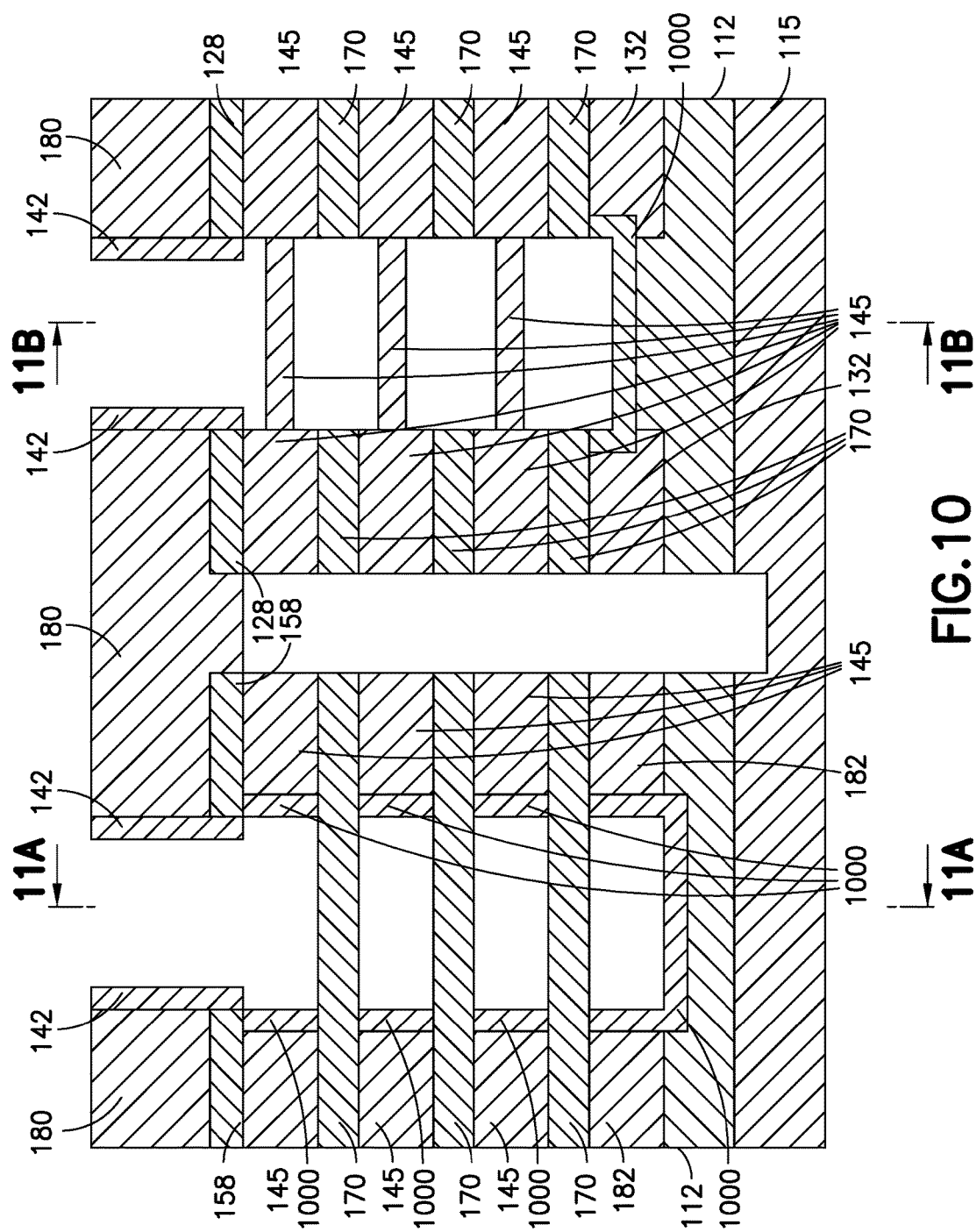
FIG. 10 is a schematic representation of the PFET and NFET structures after a low temperature Ge condensation is performed and after an oxide removal process is carried out.

Referring to FIG. 10, a low temperature Ge condensation is performed, followed by an oxide removal process. The temperature is selected to be between 500 degrees C. and 800 degrees C. so that the dimensions of the tensile strained Si layers 170 are not affected. In the condensation, the silicon is oxidized until it is completely consumed, thereby increasing the germanium content (the germanium does not oxidize). The Ge content in the relaxed SiGe 145 layers is increased from, for example, 20% to 40% (as indicated at 1000 under the edges and at the bottom of the gate in the NFET structure 110 and under the gate in the PFET structure 105) resulting in a compressive strain buildup (e.g., about 0.8% in the PFET structure 105). This also results in the nanosheets of the relaxed SiGe layers 145 being thinned across the opening of the PFET structure 105.

Figure 11:
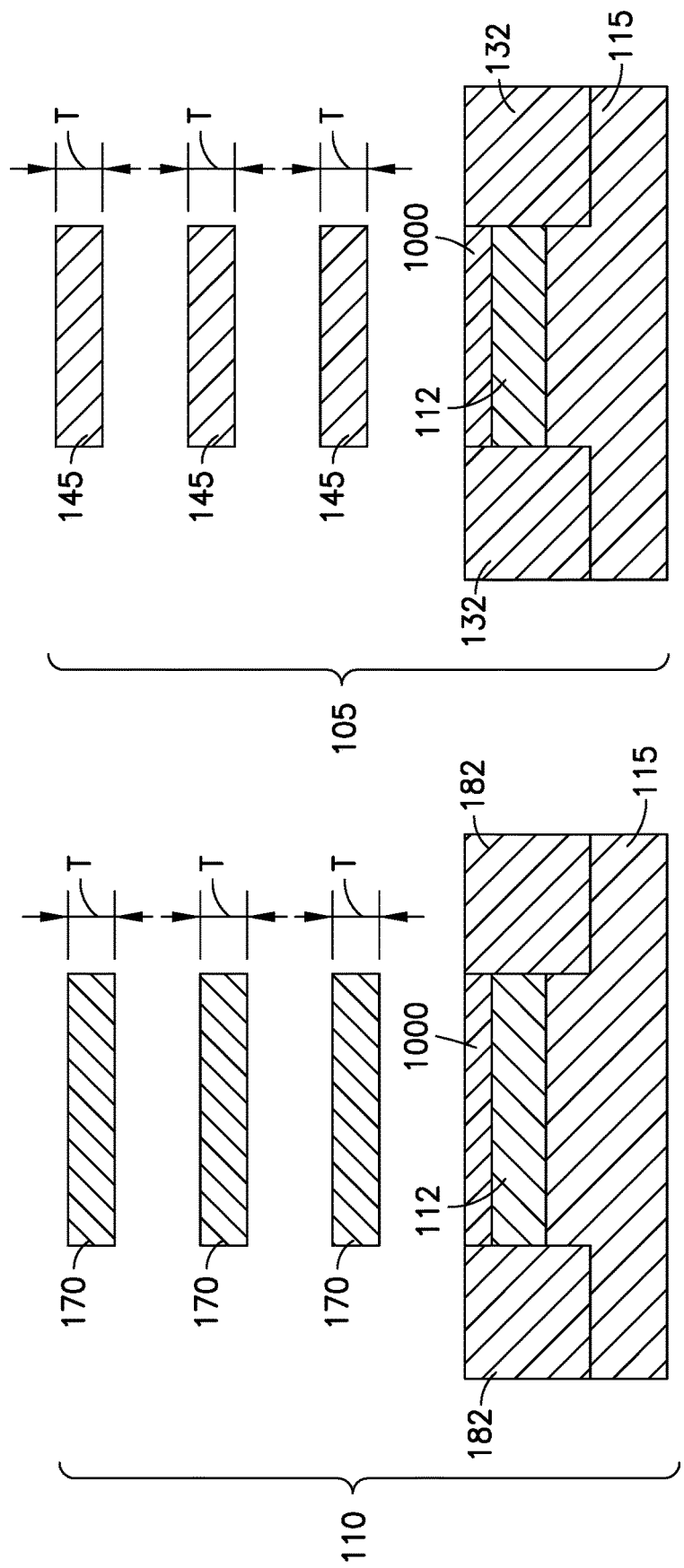
FIGS. 11A and 11B are cross-sectional views of the tensile strained Si layers in the NFET portion and of the relaxed SiGe layers in the PFET portion, respectively.

As shown in FIGS. 11A and 11B, cross-sectional views of the layers under the gate structures are shown. Referring to FIG. 11A, cross-sectional views of the tensile strained layers of Si 170 in the NFET structure 110 are shown, and referring to FIG. 11B, cross-sectional views of the compressed SiGe 145 layers in the PFET structure 105 are shown. In order to suitably control the electrostatic properties of the device 100, the thicknesses (T in FIG. 11A) of the tensile strained Si 170 layers in the NFET structure 110 are substantially the same as the thicknesses (T in FIG. 11B) of the compressed SiGe 145 layers in the PFET structure 105. To render the layers to be substantially the same in thicknesses in the final device 100, the nanosheets of the SiGe 145 (as shown in FIG. 2) start off thicker than the nanosheets of the Si 170. The starting thicknesses of the nanosheets of the SiGe 145 (FIG. 2) are defined such that at the end of the condensation process (FIGS. 11A and 11B), the nanosheets of the SiGe 145 under the gate in the PFET structure 105 are substantially the same thickness as the nanosheets of the Si 170 under the gate in the NFET structure 110.

Referring back to FIG. 1, the voids (areas indicated as "OPEN") in both the PFET structure 105 and the NFET structure 110 may be filled with a high-k dielectric/metal gate material (e.g., fill metal 150) and polished (e.g., using a CMP) to form the gate structures 140, 165 of the PFET structure 105 and the NFET structure 110. Standard middle-of-line (MOL) or back-end-of-line (BEOL) may then be continued.

Figure 12:
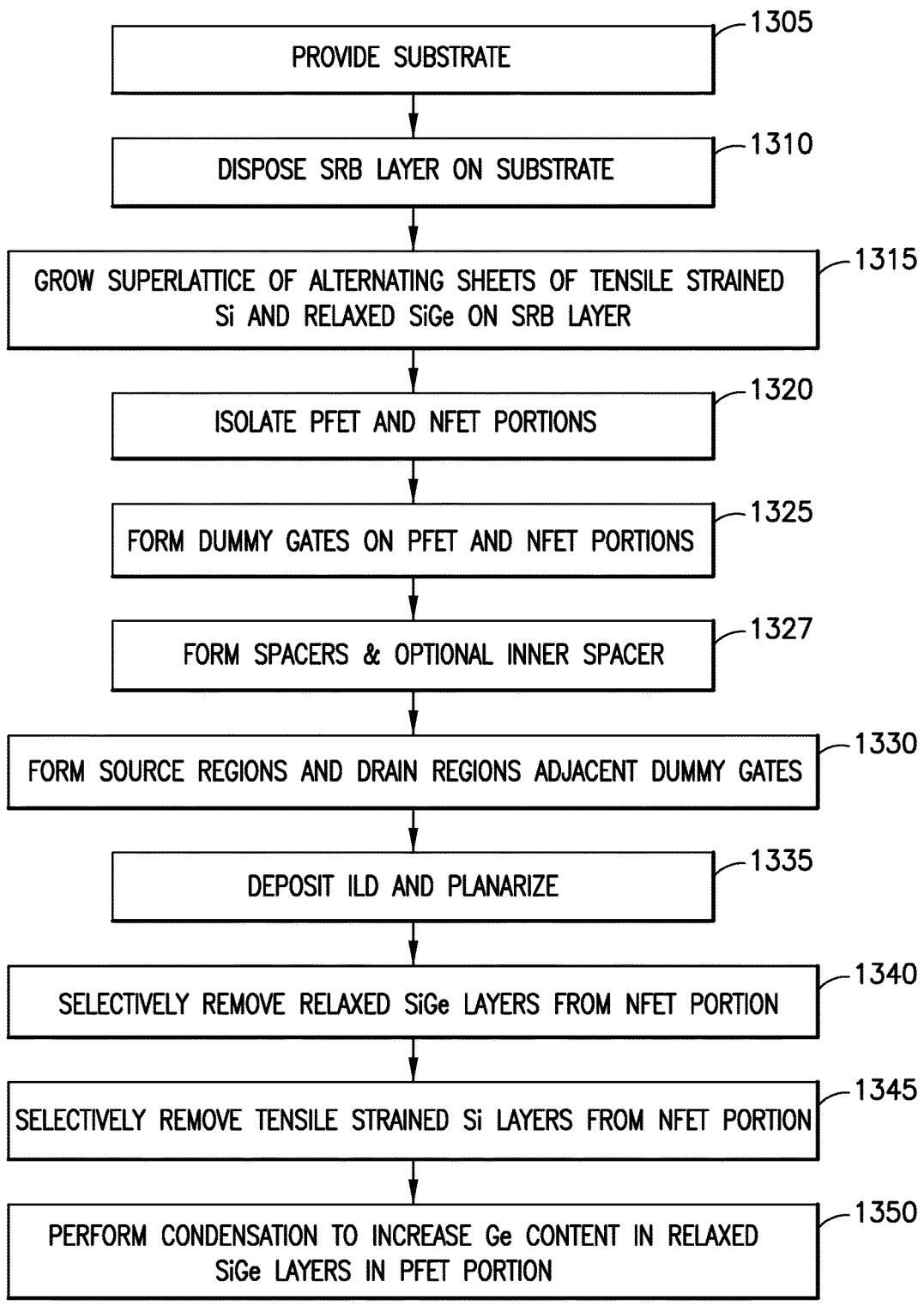
FIG. 12 is a logic flow diagram that illustrates the operation of an exemplary method, and a result of execution of computer program instructions embodied on a computer readable memory, in accordance with an exemplary embodiment of the methods for forming the strained nanosheet structures described herein.

FIG. 12 is a logic flow diagram that illustrates the operation of a method 1300, in accordance with the exemplary embodiments. In accordance with these exemplary embodiments, a substrate of bulk silicon material or silicon-germanium (Si—Ge) on insulator (SG-OI) material is provided, as indicated in block 1305. An SRB layer is disposed on the substrate, as indicated in block 1310. As indicated in block 1315, a lattice of alternating sheets of tensile strained Si and relaxed SiGe is grown on the SRB layer. As indicated in block 1320, PFET and NFET portions are isolated. Dummy gates are formed on the PFET and NFET portions, as indicated in block 1325, and spacers (as well as any optional inner spacers, if desired) are formed on the dummy gates, as indicated in block 1327. As indicated in block 1330, source regions and drain regions are formed adjacent the dummy gates. An ILD is deposited, as indicated in block 1335. A planarization step may take place. As indicated in block 1340, the relaxed SiGe layers are selectively removed from the NFET portion. As indicated in block 1345, the tensile strained Si layers are selectively removed from the PFET portion. In selectively removing layers from the PFET portion and the NFET portion, masking and etching techniques are used to mask off and remove the dummy gates. A condensation process is then performed, as indicated in block 1350, to increase the Ge content in the relaxed SiGe layers in the PFET portion and to compressively strain the relaxed SiGe layers in the PFET portion.

The various blocks of method 1300 shown in FIG. 12 may be viewed as method steps, and/or as operations that result from operation of computer program code, and/or as a plurality of coupled logic circuit elements constructed to carry out the associated function(s).

Referring now to all the Figures, in one exemplary embodiment, a method comprises: growing a lattice of alternating sheets of tensile strained silicon and relaxed silicon-germanium on a substrate; isolating a first portion of the lattice from a second portion of the lattice; forming source regions and drain regions on each of the first portion of the lattice and the second portion of the lattice; forming a first gate opening in the first portion of the lattice and a second gate opening in the second portion of the lattice; selectively removing the sheets of relaxed silicon-germanium from under the second gate opening in the second portion of the lattice; selectively removing portions of the sheets of tensile strained silicon from under the first gate opening in the first portion of the lattice; and increasing a germanium content in the relaxed silicon-germanium layers under the first gate opening in the first portion of the lattice.

The method may further comprise providing the substrate as a handle substrate and a strained relaxed buffer layer on the handle substrate, the strained relaxed buffer layer being a support for the lattice of alternating sheets of tensile strained silicon and relaxed silicon-germanium. Growing a lattice of alternating sheets of tensile strained silicon and relaxed silicon-germanium on a substrate may comprise epitaxially growing the tensile strained silicon and relaxed silicon-germanium as nanosheets. Selectively removing the sheets of relaxed silicon-germanium from the second portion of the lattice may comprise using chemical plasma etching, a wet etching technique, or a selective oxidation technique. Selectively removing the sheets of tensile strained silicon from the first portion of the lattice may comprise using a wet etching technique. Increasing a germanium content in the relaxed silicon-germanium layers under the first gate opening in the first portion of the lattice may comprise using a low temperature germanium condensation process. Using a low temperature germanium condensation process may reduce a thickness of the relaxed silicon-germanium layers under the first gate opening. The method may further comprise removing oxides after increasing a germanium content in the relaxed silicon-germanium layers under the first gate opening in the first portion of the lattice.

In another exemplary embodiment, a method comprises disposing a strained relaxed buffer layer on a handle substrate; epitaxially forming alternating sheets of tensile strained silicon and relaxed silicon-germanium on the strained relaxed buffer layer to form a lattice; disposing an isolation structure on the epitaxially formed sheets to isolate a first portion of the lattice from a second portion of the lattice; disposing a first dummy gate and spacers on an upper sheet of the first portion of the lattice and a second dummy gate and spacers on an upper sheet of the second portion of the lattice; forming source regions and drain regions on the first portion of the lattice adjacent the first dummy gate and spacers and on the second portion of the lattice adjacent the second dummy gate and spacers; depositing an interlayer dielectric on an upper surface of the formed source regions and drain regions; masking the first portion of the lattice; removing the second dummy gate; selectively removing portions of the relaxed silicon-germanium sheets under a second location from which the second dummy gate was removed thereby forming voids above and below the remaining tensile strained silicon sheets; removing the mask from the masked first portion of the lattice; masking the second portion of the lattice; removing the first dummy gate; selectively removing portions of the tensile strained silicon from under a first location from which the first dummy gate was removed thereby forming voids above and below the remaining silicon-germanium sheets; performing a low temperature condensation process to increase a germanium content in the relaxed silicon-germanium layers in the first portion of the lattice relative to the second portion of the lattice, wherein performing the low temperature condensation process reduces a thickness of the silicon-germanium layers in the first portion substantially to a thickness of the silicon sheets in the second portion; and filling the voids above and below the remaining tensile strained silicon sheets under the second location and above and below the remaining relaxed silicon germanium sheets under the first location with a high k dielectric/metal gate material.

In the method, forming source regions and drain regions on each of the first portion of the lattice and the second portion of the lattice may comprise depositing epitaxial layers of SiGe to form P+ regions on a PFET and silicon or carbon-doped silicon to form N+ regions on an NFET and driving the materials of the deposited epitaxial layers into the lattice. Forming source regions and drain regions on each of the first portion of the lattice and the second portion of the lattice may comprise implanting ions. Selectively removing portions of the relaxed silicon-germanium sheets under a second location from which the second dummy gate was removed may comprise using a wet etching technique. Using a wet etching technique may comprise etching using HCl gas. Selectively removing portions of the tensile strained silicon from under a first location from which the first dummy gate was removed may comprise using KOH or TMAH. Performing a low temperature condensation process may comprise heating to between 500 degrees C. and 800 degrees C. The method may further comprise performing an oxide removal process after performing a low temperature condensation process and before filling the voids.

In another exemplary embodiment, an apparatus comprises: a substrate having a strained relaxed buffer layer; a PFET structure on the strained relaxed buffer layer, the PFET structure comprising, a PFET gate comprising a high k dielectric/metal gate material, alternating nanosheets of relaxed silicon-germanium and the high k dielectric/metal gate material under the PFET gate, and source and drain regions disposed adjacent the alternating nanosheets of relaxed silicon-germanium and the high k dielectric/metal gate material; an NFET structure on the strained relaxed buffer, the NFET structure comprising, an NFET gate comprising the high k dielectric/metal gate material, alternating nanosheets of tensile strained silicon and the high k dielectric/metal gate material under the NFET gate, and source and drain regions disposed adjacent the alternating nanosheets of tensile strained silicon and the high k dielectric/metal gate material; and an isolation structure separating the PFET structure and the NFET structure.

The source and drain regions disposed in the PFET structure and the source and drain regions disposed in the NFET structure may extend into the strained relaxed buffer. The apparatus may further comprise an interlayer dielectric disposed adjacent the PFET structure and the NFET structure.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A method, comprising:
    growing a lattice of alternating sheets of tensile strained silicon and relaxed silicon-germanium on a substrate;
    isolating a first portion of the lattice from a second portion of the lattice;
    forming source regions and drain regions on each of the first portion of the lattice and the second portion of the lattice;
    forming a first gate opening in the first portion of the lattice and a second gate opening in the second portion of the lattice;
    selectively removing the sheets of relaxed silicon-germanium from under the second gate opening in the second portion of the lattice;
    selectively removing portions of the sheets of tensile strained silicon from under the first gate opening in the first portion of the lattice; and
    increasing a germanium content in the relaxed silicon-germanium layers under the first gate opening in the first portion of the lattice.

2. The method of claim 1, further comprising providing the substrate as a handle substrate and a strained relaxed buffer layer on the handle substrate, the strained relaxed buffer layer being a support for the lattice of alternating sheets of tensile strained silicon and relaxed silicon-germanium.

3. The method of claim 1, wherein growing a lattice of alternating sheets of tensile strained silicon and relaxed silicon-germanium on a substrate comprises epitaxially growing the tensile strained silicon and relaxed silicon-germanium as nanosheets.

4. The method of claim 1, wherein selectively removing the sheets of relaxed silicon-germanium from the second portion of the lattice comprises using chemical plasma etching, a wet etching technique, or a selective oxidation technique.

5. The method of claim 1, wherein selectively removing the sheets of tensile strained silicon from the first portion of the lattice comprises using a wet etching technique.

6. The method of claim 1, wherein increasing a germanium content in the relaxed silicon-germanium layers under the first gate opening in the first portion of the lattice comprises using a low temperature germanium condensation process.

7. The method of claim 6, wherein using a low temperature germanium condensation process reduces a thickness of the relaxed silicon-germanium layers under the first gate opening.

8. The method of claim 1, further comprising removing oxides after increasing a germanium content in the relaxed silicon-germanium layers under the first gate opening in the first portion of the lattice.

9. A method, comprising:
    disposing a strained relaxed buffer layer on a handle substrate;
    epitaxially forming alternating sheets of tensile strained silicon and relaxed silicon-germanium on the strained relaxed buffer layer to form a lattice;
    disposing an isolation structure on the epitaxially formed sheets to isolate a first portion of the lattice from a second portion of the lattice;
    disposing a first dummy gate and spacers on an upper sheet of the first portion of the lattice and a second dummy gate and spacers on an upper sheet of the second portion of the lattice;
    forming source regions and drain regions on the first portion of the lattice adjacent the first dummy gate and spacers and on the second portion of the lattice adjacent the second dummy gate and spacers;
    depositing an interlayer dielectric on an upper surface of the formed source regions and drain regions;
    masking the first portion of the lattice;

removing the second dummy gate;
selectively removing portions of the relaxed silicon-germanium sheets under a second location from which the second dummy gate was removed thereby forming voids above and below the remaining tensile strained silicon sheets;
removing the mask from the masked first portion of the lattice;
masking the second portion of the lattice;
removing the first dummy gate;
selectively removing portions of the tensile strained silicon from under a first location from which the first dummy gate was removed thereby forming voids above and below the remaining silicon germanium sheets;
performing a low temperature condensation process to increase a germanium content in the relaxed silicon-germanium layers in the first portion of the lattice relative to the second portion of the lattice, wherein performing the low temperature condensation process reduces a thickness of the silicon-germanium layers in the first portion substantially to a thickness of the silicon sheets in the second portion; and
filling the voids above and below the remaining tensile strained silicon sheets under the second location and above and below the remaining relaxed silicon germanium sheets under the first location with a high k dielectric/metal gate material.

10. The method of claim 9, wherein forming source regions and drain regions on each of the first portion of the lattice and the second portion of the lattice comprises depositing epitaxial layers of SiGe to form P+ regions on a PFET and silicon or carbon-doped silicon to form N+ regions on an NFET and driving the materials of the deposited epitaxial layers into the lattice.

11. The method of claim 9, wherein forming source regions and drain regions on each of the first portion of the lattice and the second portion of the lattice comprises implanting ions.

12. The method of claim 9, wherein selectively removing portions of the relaxed silicon-germanium sheets under a second location from which the second dummy gate was removed comprises using a wet etching technique.

13. The method of claim 12, wherein using a wet etching technique comprises etching using HCl gas.

14. The method of claim 9, wherein selectively removing portions of the tensile strained silicon from under a first location from which the first dummy gate was removed comprises using KOH or TMAH.

15. The method of claim 9, wherein performing a low temperature condensation process comprises heating to between 500 degrees C. and 800 degrees C.

16. The method of claim 9, further comprising performing an oxide removal process after performing a low temperature condensation process and before filling the voids.

17. An apparatus, comprising:
a substrate having a strained relaxed buffer layer;
a PFET structure on the strained relaxed buffer layer, the PFET structure comprising,
a PFET gate comprising a high k dielectric/metal gate material,
alternating nanosheets of relaxed silicon-germanium and the high k dielectric/metal gate material under the PFET gate, and
source and drain regions disposed adjacent the alternating nanosheets of relaxed silicon-germanium and the high k dielectric/metal gate material;
an NFET structure on the strained relaxed buffer, the NFET structure comprising,
an NFET gate comprising the high k dielectric/metal gate material,
alternating nanosheets of tensile strained silicon and the high k dielectric/metal gate material under the NFET gate, and
source and drain regions disposed adjacent the alternating nanosheets of tensile strained silicon and the high k dielectric/metal gate material; and
an isolation structure separating the PFET structure and the NFET structure.

18. The apparatus of claim 17, wherein the source and drain regions disposed in the PFET structure and the source and drain regions disposed in the NFET structure extend into the strained relaxed buffer.

19. The apparatus of claim 17, further comprising an interlayer dielectric disposed adjacent the PFET structure and the NFET structure.

* * * * *